(12) United States Patent
Chen et al.

(10) Patent No.: US 6,277,755 B1
(45) Date of Patent: Aug. 21, 2001

(54) METHOD FOR FABRICATING AN INTERCONNECT

(75) Inventors: Shuenn-Jeng Chen, Tainan Hsien; Chih-Ching Hsu, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/466,686

(22) Filed: Dec. 20, 1999

(51) Int. Cl.⁷ .................................. H01L 21/303
(52) U.S. Cl. .................. 438/700; 438/723; 438/724; 438/740; 438/743; 438/744; 438/756; 438/757
(58) Field of Search .................. 438/700, 724, 438/723, 740, 743, 744, 756, 757

(56) References Cited

U.S. PATENT DOCUMENTS

| | | |
|---|---|---|
| 5,821,153 * 10/1998 | Tsai et al. | 438/439 |
| 5,969,422 * 10/1999 | Ting et al. | 257/762 |
| 5,989,957 * 11/1999 | Ngo et al. | 438/257 |
| 6,001,730 * 12/1999 | Farkas et al. | 438/627 |
| 6,040,619 * 3/2000 | Wang et al. | 257/649 |

* cited by examiner

Primary Examiner—Robert Kunemund
Assistant Examiner—Charlotte A. Brown
(74) Attorney, Agent, or Firm—Charles C.H. Wu & Associates

(57) ABSTRACT

A method for fabricating an interconnect structure by a dual damascene process is described, in which a first low dielectric constant material is formed on a substrate, followed by forming a gradient silicon oxy-nitride layer on the first low dielectric constant. A second low dielectric constant layer is further formed on the gradient silicon oxy-nitride layer. A trench line is then formed in the second low dielectric constant material using the gradient silicon oxy-nitride layer as an etch-stop, followed by forming a via under the trench line.

20 Claims, 1 Drawing Sheet

METHOD FOR FABRICATING AN INTERCONNECT

BACKGROUND OF THE INVENTION

1. Field of the Invention

The present invention relates to a fabrication method for an interconnect structure of an integrated circuit. More particularly, the present invention relates to a fabrication method for an inter-metal dielectric layer.

2. Description of the Related Art

The multilevel interconnect structure has been widely employed to accommodate the continuing demand in the integrated circuit manufacturing to produce a more powerful and highly integrated device in a smaller area. In such an interconnect structure, a conductive material, for example, a metal line, on one interconnect level is electrically insulated from a patterned conductive material on the other interconnect level by an inter-metal dielectric (IMD) layer. Connections between the conductive material on the various levels of the interconnect are made by forming an opening, which is often referred as a via, in the inter-metal dielectric layer to expose a certain portion of the underlying metal line. A conductive contact, also known as a via plug, is then formed in the via to connect the underlying metal line with the overlying metal line. The via and the via plug thus serve to enable an electrical contact between the conductive materials at various interconnect levels.

According to the conventional fabrication method for an interconnect structure by means of a dual damascene manufacturing process, a first silicon oxide layer, a silicon nitride layer and a second silicon oxide layer are sequentially formed on a substrate to serve as the inter-metal dielectric layer. Photolithography and etching are further conducted to form a trench line in the second silicon oxide layer. During the definition of the trench line, the silicon nitride layer serves as an etch stop layer, preventing an over-etch from occurring during the formation of the trench line. Photolithography and etching are further conducted to define the silicon nitride layer and the first silicon oxide layer, thereby to form a via under the trench line. A copper layer is then subsequently formed to fill the trench line and the via. These processing steps are then repeated to form the next level of the interconnect.

A consequence of having multiple layers of the patterned conductive material separated by an insulating layer is the formation of an undesired parasitic capacitance. The presence of parasitic capacitance in microelectronic devices contributes to adverse effects such as RC delay, power dissipation and cross-talk. The silicon nitride layer, which is a part of the inter-metal dielectric layer and also plays a role as an etch stop during the formation of the trench line, has a dielectric constant (k) of about 7, which significantly increases the inter-metal dielectric (IMD) capacitance.

SUMMARY OF THE INVENTION

Based on the foregoing, the present invention provides a fabrication method for an interconnect structure, wherein the IMD capacitance of the inter-metal dielectric layer is lower. The issues relating to a high IMD capacitance, such as RC delay, power dissipation and cross-talk, are thus mitigated. The inter-metal dielectric layer, which comprises a gradient silicon oxy-nitride layer, can also serve as an etch-stop during the oxide etching process.

The present invention provides a dual damascene process for an interconnect structure, wherein the inter-metal dielectric layer has a lower dielectric constant and can serve as an etch-stop during the oxide-etching process when forming the trench line. The method includes forming a first silicon oxide layer on a substrate. A gradient silicon oxy-nitride layer is then formed on the first silicon oxide layer, wherein the silicon oxy-nitride layer possesses an oxide-like property at the bottom and a silicon nitride-like property gradually increases towards the top of the silicon oxy-nitride layer. A second silicon oxide layer is further formed on the gradient silicon oxy-nitride layer. Photolithography and etching are then conducted on the second silicon oxide layer while using the silicon oxy-nitride layer as an etch-stop to form a trench line in the second silicon oxide layer. Photolithography and etching are again conducted on the silicon oxy-nitride layer, followed by removing the first silicon oxide layer and forming a via under the trench line. A conductive material is then formed, filling the trench line and the via simultaneously.

According to this embodiment of the present invention, a gradient silicon oxy-nitride layer is formed, wherein the silicon oxy-nitride layer possesses an oxide-like property at the bottom, and a silicon nitride property gradually increases towards the top of the silicon oxy-nitride layer. As a result, the silicon oxy-nitride layer can serve as an etch-stop layer during the oxide etching process when forming the trench line. Since the dielectric constant at the bottom of the gradient oxy-nitride layer is about 7 to about 4.2, the overall IMD capacitance is thereby reduced. The problems relating to a high IMD capacitance, such as RC time delay, power dissipation and cross-talk, are thus mitigated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1A:
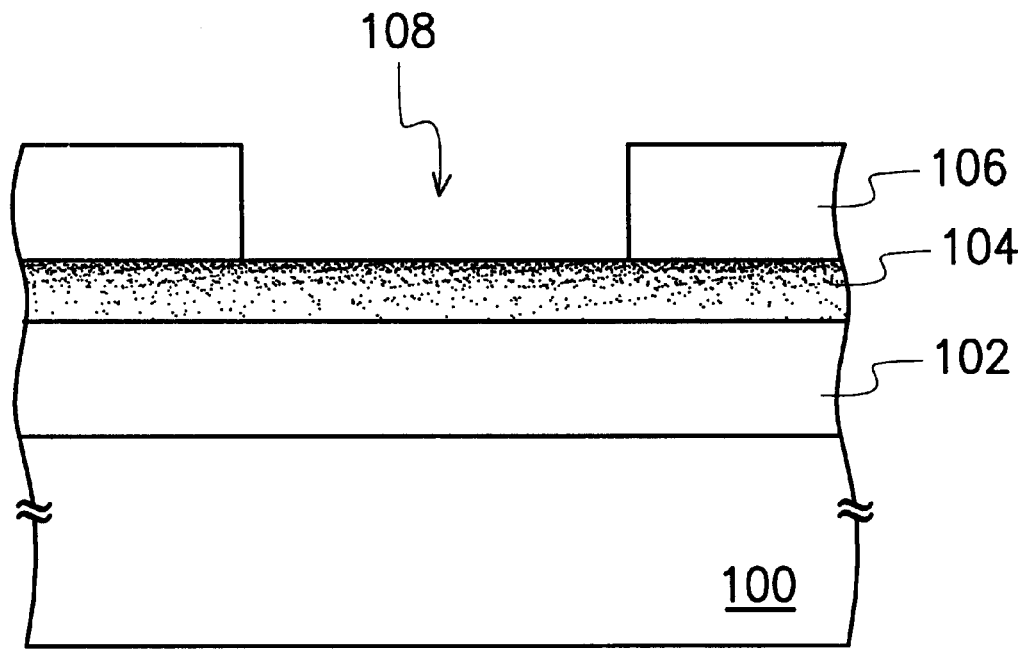
FIGS. 1A to 1B are schematic, cross-sectional views showing the fabrication of an interconnect structure by a dual damascene process according to one preferred embodiment of the present invention.
Figure 1B:
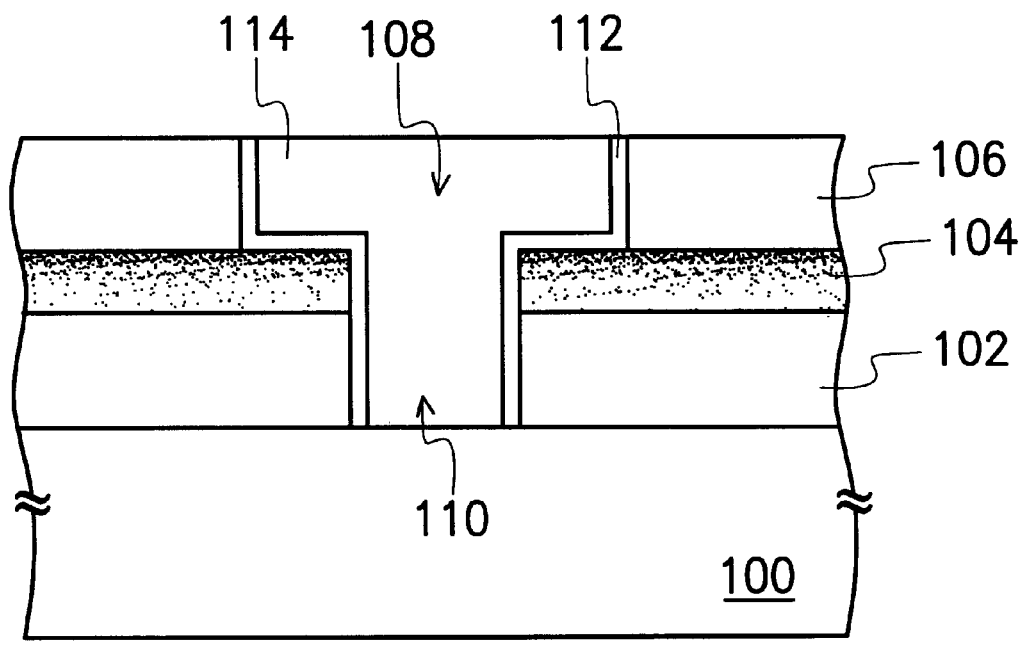

FIGS. 1A to 1B are schematic, cross-sectional views showing the fabrication of an interconnect structure by a dual damascene process according one preferred embodiment of the present invention.

Referring to FIG. 1A, a dielectric layer 102 is formed on a substrate 100, wherein the dielectric layer 102 has a low dielectric constant (k). The low dielectric constant dielectric layer 102, such as silicon dioxide, is formed by chemical vapor deposition.

Thereafter, a gradient silicon oxy-nitride layer 104 is formed to cover the dielectric layer 102, in which there is a gradual transition from an oxide-like property at the bottom of the silicon oxy-nitride layer 104 to a more nitride-like property at the top of the silicon oxy-nitride layer 104. The gradient silicon oxy-nitride layer 104 is formed by plasma-enhanced chemical vapor deposition utilizing a reactant gas mixture of silane ($SiH_4$), nitrous oxide ($N_2O$) and nitrogen ($N_2$). Concentration of nitrous oxide is varied from high to low during the deposition process to provide a more oxide-concentrated film at the bottom of the silicon oxy-nitride layer 104 to a more nitride-concentrated film at the top of the silicon oxy-nitride layer 104. A dielectric layer 106 is further formed on the silicon oxy-nitride layer 104, wherein the low dielectric constant dielectric layer 106, such as silicon dioxide, is formed by, for example, chemical vapor deposition.

Photolithography and etching are further conducted to form a trench line 108 in the dielectric layer 106. Since the concentration of nitrous oxide is lower by the end of the plasma-enhanced chemical vapor deposition process, the gradient silicon oxy-nitride layer 104 possesses a more silicon nitride property at the top of the silicon oxy-nitride layer 104. During the definition of the trench line 108, the silicon oxy-nitride layer 104 can thus serve as an etch-stop, preventing an over-etching from occurring during the formation of the trench line 108.

Continuing to FIG. 1B, photolithography and etching are further conducted to define the silicon oxy-nitride layer 104, followed by removal of a portion of the silicon oxide layer 102 to form a via 110 under the trench line 108. A conformal barrier layer 112 and a conductive layer 114 are sequentially formed to fill the trench line 108 and the via 110. The barrier layer 112 is, for example, titanium nitride (TiN), and the conductive layer 114 is, for example, copper. The barrier layer 112 and the conductive layer 114 are formed by, for example, physical vapor deposition (PVD) or chemical vapor deposition (CVD).

According to the preferred embodiment of the present invention, a gradient silicon oxy-nitride layer is formed between two low dielectric constant dielectric layers. Since the gradient silicon oxy-nitride layer provides a silicon nitride-like property at the top of the silicon oxy-nitride layer, the gradient silicon oxy-nitride layer can serve as an etch-stop during the oxide etching when forming the trench line. Furthermore, a silicon oxide-like property is gradually increased towards the bottom of the silicon oxy-nitride layer. The dielectric constant at the bottom of the gradient silicon oxy-nitride layer is only about 7 to 4.2. The overall IMD capacitance, as a result, is lower. The problems relating to a high IMD capacitance such as RC time delay, power dissipation and cross-talk are thus mitigated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating an interconnect, the method comprising the steps of:
   forming a first dielectric layer on a substrate;
   forming a gradient silicon oxy-nitride layer on the first dielectric layer, wherein a more oxide-concentrated film is formed at a bottom of the silicon oxy-nitride layer and a more nitride-concentrated film is formed at a top of the silicon oxy-nitride layer, so as to reduce a dielectric constant of the silicon oxy-nitride layer;
   forming a second dielectric layer on the gradient silicon oxy-nitride layer;
   forming a trench line in the second dielectric layer with the gradient silicon oxy-nitride layer serving as an etch-stop;
   removing portions of the gradient silicon oxy-nitride layer and the first dielectric layer;
   forming a via under the trench line in the gradient silicon oxy-nitride layer and the first dielectric layer; and
   filling the via and the trench line with a conductive material.

2. The method according to claim 1, wherein the first dielectric layer is a low dielectric constant material.

3. The method according to claim 1, wherein the first dielectric layer includes a silicon dioxide layer.

4. The method according to claim 1, wherein the first dielectric layer is formed by chemical vapor deposition.

5. The method according to claim 1, wherein the gradient silicon oxy-nitride layer is formed by plasma-enhanced chemical vapor deposition.

6. The method according to claim 5, wherein nitrous oxide of a reactant gas mixture used in the plasma-enhanced chemical vapor deposition is varied from high to low during the step of deposition.

7. The method according to claim 1, wherein the second dielectric layer includes a low dielectric constant material.

8. The method according to claim 1, wherein the second dielectric layer includes a silicon dioxide layer.

9. The method according to claim 1, wherein the via is formed by photolithographically processing and then etching the gradient silicon oxy-nitride layer and the first dielectric layer.

10. The method for fabricating an inter-metal dielectric layer for an interconnect structure according to claim 1, wherein the conductive layer includes a copper layer.

11. A damascene process comprising the steps of:
    forming a first low dielectric constant material on a substrate;
    forming a gradient silicon oxy-nitride layer on the first dielectric layer, wherein a more oxide-concentrated film is formed at a bottom of the silicon oxy-nitride layer and a more nitride-concentrated film is formed at a top of the silicon oxy-nitride, so as to reduce a dielectric constant of the silicon oxy-nitride layer;
    forming a second low dielectric constant material on the gradient silicon oxy-nitride layer;
    forming a via in the gradient silicon oxy-nitride layer and in the first low dielectric constant material under the trench line;
    forming a conformal barrier layer in the via and in the trench line; and
    filling the via and the trench line with a conductive material.

12. The dual damascene process according to claim 1, wherein the gradient silicon oxy-nitride layer is formed by plasma-enhanced chemical vapor deposition.

13. The dual damascene process according to claim 11, wherein the first low dielectric constant material includes silicon dioxide.

14. A fabrication method for an etch-stop layer comprising forming a silicon oxy-nitride layer, wherein a more oxide-concentrated film is formed at a bottom of the silicon oxy-nitride layer and a more nitride-concentrated film is formed at a top of the silicon oxy-nitride layer, so as to reduce a dielectric constant of the silicon oxy-nitride layer.

15. The method according to claim 14, wherein the silicon oxy-nitride layer is formed by plasma-enhanced chemical vapor deposition.

16. The method according to claim 15, wherein a gas mixture for the plasma-enhanced chemical vapor deposition process includes silane, nitrous oxide and nitrogen.

17. The method according to claim 16, wherein a concentration of nitrous oxide is varied from high to low during the deposition process.

18. The method according to claim 1, wherein the step of forming the gradient silicon oxy-nitride layer is performing a deposition process to form the gradient silicon oxy-nitride layer.

19. The method according to claim 12, wherein the step of forming the gradient silicon oxy-nitride layer is performing a deposition process to form the gradient silicon oxy-nitride layer.

20. The method according to claim 14, wherein the step of forming the gradient silicon oxy-nitride layer is performing a deposition process to form the gradient silicon oxy-nitride layer.

* * * * *